United States Patent
Guo et al.

(10) Patent No.: US 9,455,282 B2
(45) Date of Patent: Sep. 27, 2016

(54) MANUFACTURING METHOD OF AN ARRAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Huibin Guo, Beijing (CN); Shoukun Wang, Beijing (CN); Xiaowei Liu, Beijing (CN); Yuchun Feng, Beijing (CN); Zongjie Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/519,480

(22) Filed: Oct. 21, 2014

(65) Prior Publication Data

US 2015/0348999 A1    Dec. 3, 2015

(30) Foreign Application Priority Data

May 29, 2014   (CN) .......................... 2014 1 0234421

(51) Int. Cl.
| H01L 33/00 | (2010.01) |
| G02F 1/1362 | (2006.01) |
| H01L 27/12 | (2006.01) |
| H01L 29/45 | (2006.01) |
| H01L 29/49 | (2006.01) |

(52) U.S. Cl.
CPC ....... *H01L 27/1262* (2013.01); *H01L 27/1288* (2013.01); *H01L 29/458* (2013.01); *H01L 29/4908* (2013.01)

(58) Field of Classification Search
None
See application file for complete search history.

(56) References Cited

U.S. PATENT DOCUMENTS

2008/0297678 A1* 12/2008 Lee .................. G02F 1/136209
349/44
2009/0101908 A1* 4/2009 Kwack ............. G02F 1/136286
257/59
2012/0139045 A1   6/2012 Kim

FOREIGN PATENT DOCUMENTS

CN    101320740 A    12/2008
CN    101414085 A    4/2009

OTHER PUBLICATIONS

1st office action issued in corresponding Chinese application No. 201410234421.0 dated Mar. 22, 2016.

* cited by examiner

*Primary Examiner* — Pamela E Perkins
(74) *Attorney, Agent, or Firm* — Nath, Goldberg & Meyer; Joshua B. Goldberg; Christopher Thomas

(57) ABSTRACT

Provided is a manufacturing method of an array substrate with an etching stop layer. The method includes: forming a pattern including a gate, a gate line and a common electrode line on a substrate through a first patterning process; forming a gate insulation layer, an active layer film and an etching stop layer through a second patterning process; wherein, the etching stop layer corresponds to a gap between a source and a drain which are to be formed, and a via hole exposing the common electrode line is formed above the common electrode line; forming at least an active layer, a pattern including source, drain and data line and a protection layer through a third patterning process; wherein, the protection layer exposes a part of the drain; and forming at least a pixel electrode through a fourth patterning process; wherein, the pixel electrode is electrically connected with the drain.

10 Claims, 10 Drawing Sheets

MANUFACTURING METHOD OF AN ARRAY SUBSTRATE

FIELD OF THE INVENTION

The present invention relates to the manufacturing field of display device, and particularly to a manufacturing method of an array substrate.

BACKGROUND OF THE INVENTION

Array substrate is one of the main components of the Thin Film Transistor Liquid Crystal Display (TFT-LCD).

In the prior art, when a source, a drain and a gap therebetween are formed on an active layer through an etching process, in order to reduce the extent to which the active layer, as a whole, is affected by etching liquid or etching gas, the thickness of the active layer is generally manufactured thicker, for example, may reach 2000 Å to 3000 Å, thereby ensuring that even when the active layer is over-etched, the electrical performance thereof will not be greatly affected, and thus, the characteristics of the active layer and TFT switches are stabilized. However, the increasing of the thickness of the active layer will result in the increase in the off-state current of the TFT, which causes the problem that when the array substrate is used in a display device, because the off-state current of the TFT is large, the current used for displaying the previous frame of image remains at the time when the next frame of image should be displayed, so that the afterimage of the displayed image is relatively severe, thereby degrading the displaying quality. Meanwhile, when an active layer with a relatively large thickness is manufactured, the requirement for the manufacturing process thereof is more strict, and also more difficulty, which leads to a longer manufacturing cycle.

Accordingly, the TFT that is used commonly in the industrial field has a structure with an etching stop layer, that is, one silicon nitride ($SiN_x$) or silicon dioxide ($SiO_2$) film layer with dense structure and good insulation performance is provided at a place, on the active layer, corresponding to the gap between the source and the drain, thereby preventing the damage to the performance of the active layer at the time of forming the source, the drain and the gap therebetween. Meanwhile, due to the existence of the etching stop layer, it is not necessary to increase the thickness of the active layer additionally, the thickness of the active layer can be reduced to 300 to 1000 Å, and the thickness is greatly reduced compared with a case where there is no etching stop layer existing, thus, the off-state current of the TFT is relatively small, and the afterimage of the displayed image is slight when applying the TFT to a display device, so that good display quality of the display device is ensured.

However, since a process of forming an etching stop layer on the active layer is additionally added, at least five patterning processes are required to manufacture a bottom gate type array substrate with the etching stop layer, and specifically include: a process of forming a pattern including gates and gate lines, a process of forming a gate insulation layer, a process of forming an active layer, a process of forming an etching stop layer, a process of forming a pattern including sources, drains and data lines, and a process of forming pixel electrodes. Each of the patterning processes includes processes such as film forming, exposure, developing, etching and stripping. Obviously, the more the times of the patterning processes are, the higher the investment in the production facility is and the longer the manufacturing cycle is.

Therefore, how to reduce the times of the patterning processes when manufacturing an array substrate with an etching stop layer is an important technical issue that needs to be solved urgently in the related art.

SUMMARY OF THE INVENTION

The embodiments of the present invention provide a manufacturing method of an array substrate, which can reduce the times of the patterning processes required for manufacturing an array substrate with an etching stop layer, thereby improving the production efficiency and reducing the cost.

To achieve the above object, the embodiments of the present invention employ the technical solutions as below.

An embodiment of the present invention provides a manufacturing method of an array substrate, and the method includes steps of: forming a pattern including a gate, a gate line and a common electrode line on a substrate through a first patterning process; forming a gate insulation layer, an active layer film and an etching stop layer on the substrate with the pattern including the gate, the gate line and the common electrode line formed thereon through a second patterning process; wherein, the etching stop layer corresponds to a gap between a source and a drain which are to be formed, and a via hole exposing the common electrode line is formed above the common electrode line; forming at least an active layer, a pattern including the source, the drain and a data line and a protection layer on the substrate with the gate insulation layer, the active layer film and the etching stop layer formed thereon through a third patterning process; wherein, the protection layer exposes a part of the drain; and forming at least a pixel electrode on the substrate with at least the active layer, the pattern including the source, the drain and the data line and the protection layer formed thereon through a fourth patterning process; wherein, the pixel electrode is electrically connected with the drain.

Preferably, the step of forming a gate insulation layer, an active layer film and an etching stop layer on the substrate with the pattern including the gate, the gate line and the common electrode line formed thereon through a second patterning process; wherein, the etching stop layer corresponds to a gap between a source and a drain which are to be formed, and a via hole exposing the common electrode line is formed above the common electrode line, includes sub-steps of:

forming a gate insulation layer film, an active layer film and an etching stop layer film sequentially on the substrate with the pattern including the gate, the gate line and the common electrode line formed thereon, and forming a photoresist layer on the etching stop layer film; forming a photoresist completely remaining portion, a photoresist half-remaining portion and a photoresist completely removed portion after exposing and developing the substrate with the photoresist layer formed thereon by using a first halftone mask or a first gray-tone mask; wherein, the photoresist completely remaining portion corresponds to an area where the etching stop layer is to be formed, the photoresist completely removed portion corresponds to an area where the via hole is to be formed, and the photoresist half-remaining portion corresponds to the other areas; removing parts of the etching stop layer film, the active layer film and the gate insulation layer film which are exposed in the photoresist completely removed portion by using an etching process, thereby forming the via hole; removing the photoresist corresponding to the photoresist half-remaining portion by using an ashing process, thereby exposing a part of the etching stop layer film; removing the exposed part of the etching stop layer film by using an etching process, thereby forming the etching stop layer; and removing the photoresist corresponding to the photoresist completely remaining portion by using a stripping process.

Preferably, the active layer film includes an amorphous silicon active layer film; the step of forming at least an active layer, a pattern including the source, the drain and a data line and a protection layer on the substrate with the gate insulation layer, the active layer film and the etching stop layer formed thereon through a third patterning process; wherein, the protection layer exposes a part of the drain, includes a step of:

forming an amorphous silicon active layer, an ohmic contact layer, a pattern including the source, the drain and the data line and the protection layer on the substrate with the gate insulation layer, the amorphous silicon active layer film and the etching stop layer formed thereon through the third patterning process; wherein, the protection layer exposes a part of the drain; the ohmic contact layer is at least contacted with the source, the drain and the amorphous silicon active layer.

Further preferably, the formed ohmic contact layer is also contact with the etching stop layer.

Preferably, the step of forming an amorphous silicon active layer, an ohmic contact layer, a pattern including the source, the drain and the data line and the protection layer on the substrate with the gate insulation layer, the amorphous silicon active layer film and the etching stop layer formed thereon through the third patterning process; wherein, the protection layer exposes a part of the drain; the ohmic contact layer is at least contacted with the source, the drain and the amorphous silicon active layer, includes sub-steps of:

forming an ohmic contact layer film, an source-drain metal layer film and a protection layer film on the substrate with the gate insulation layer, the amorphous silicon layer film and the etching stop layer formed thereon, and forming a photoresist layer on the protection layer film; forming a photoresist completely remaining portion, a photoresist half-remaining portion and a photoresist completely removed portion after exposing and developing the substrate with the photoresist layer formed thereon by using a second halftone mask or a second gray-tone mask; wherein, the photoresist completely remaining portion corresponds to an area where the source, the drain and the data line are to be formed, the photoresist half-remaining portion corresponds to an area where the protection layer to be formed exposes the drain, and the photoresist completely removed portion corresponds to the other areas; removing parts of the protection layer film and the source-drain metal layer film which are exposed in the photoresist completely removing portion by using an etching process, thus forming the pattern including the source, the drain and the data line, and exposing a part of the ohmic contact layer film; removing the photoresist corresponding to the photoresist half-remaining portion by using an ashing process, thus exposing a part of the protection layer film; removing the exposed parts of the ohmic contact layer film and the amorphous silicon layer film by using an etching process, thus forming the ohmic contact layer, the active layer and the protection layer; wherein, the protection layer exposes a part of the drain; and removing the photoresist corresponding to the photoresist completely remaining portion by using a stripping process.

Based on the above, preferably, the ohmic contact layer includes a N-doped amorphous silicon layer.

Preferably, the step of forming at least pixel electrode on the substrate with at least the active layer, the pattern including the source, the drain and the data line and the protection layer formed thereon through a fourth patterning process; wherein, the pixel electrode is electrically connected with the drain, includes a step of:

forming the pixel electrode and a common electrode via hole connecting line on the substrate with at least the active layer, the pattern including the source, the drain and the data line and the protection layer formed thereon through the fourth patterning process; wherein, the pixel electrode is electrically connected with the drain; and the common electrode via hole connecting line is electrically connected with the common electrode line.

Further preferably, the step of forming the pixel electrode and a common electrode via hole connecting line on the substrate with at least the active layer, the pattern including the source, the drain and the data line and the protection layer formed thereon, through the fourth patterning process; wherein, the pixel electrode is electrically connected with the drain; and the common electrode via hole connecting line is electrically connected with the common electrode line, includes sub-steps of:

forming a transparent electrode film on the substrate with at least the active layer, the pattern including the source, the drain and the data line and the protection layer formed thereon, and forming a photoresist layer on the transparent electrode film; forming a photoresist completely remaining portion and a photoresist completely removed portion after exposing and developing the substrate with the photoresist layer formed thereon by using a mask; wherein, the photoresist completely remaining portion corresponds to areas where the common electrode via hole connecting line and the pixel electrode are to be formed, the photoresist completely removed portion corresponds to the other areas; removing a part of the transparent electrode film exposed in the photoresist completely removed portion by using an etching process, thus forming the pixel electrode and the common electrode via hole connecting line; removing the photoresist corresponding to the photoresist completely remaining portion by using a stripping process.

With the manufacturing method provided by the embodiments of the present invention, the array substrate with the etching stop layer can be produced by using only four patterning processes, and compared with the prior art in which at least five patterning processes are required, the manufacturing method provided by the present invention can reduce the manufacturing processes of the substrate effectively, improve the production efficiency and reduce the cost.

BRIEF DESCRIPTION OF THE DRAWINGS

To explain the technical solutions of the embodiments of the present invention or in the prior art more clearly, the accompanying drawings required to be used in the description of the embodiments or the prior art will be introduced briefly below. Obviously, the accompanying drawings described below are only a part of the embodiments of the present invention, a person skilled in the art may obtain other drawings based on these drawings without any creative effort.

DETAILED DESCRIPTION OF THE EMBODIMENTS

The technical solutions of the embodiments of the present invention will be described clearly and thoroughly, in connection with the accompanying drawings. Obviously, the described embodiments are only a part but not all of the embodiments of the present invention. All the other embodiments obtained by the person skilled in the art, without any creative effort, based on the embodiments of the present invention falls within the scope of the present invention.

Figure 1:
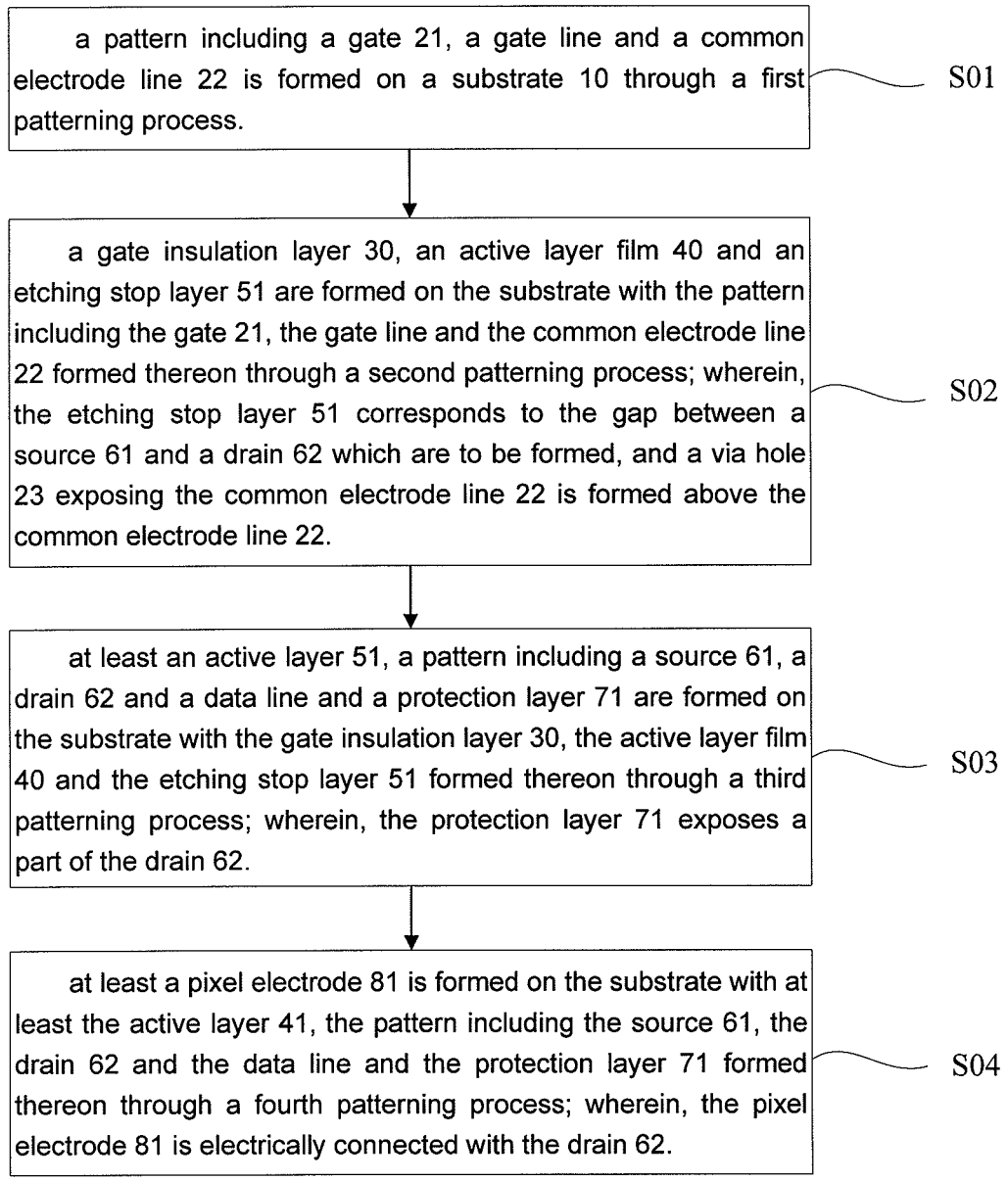
FIG. 1 is a flow chart schematically illustrating a manufacturing method of an array substrate according to an embodiment of the present invention.

An embodiment of the present invention provides a manufacturing method of an array substrate 01, and as shown in FIG. 1, the manufacturing method mainly includes the steps S01-S04.

S01, a pattern including a gate 21, a gate line and a common electrode line 22 is formed on a substrate 10 through a first patterning process.

S02, a gate insulation layer 30, an active layer film 40 and an etching stop layer 51 are formed on the substrate with the pattern including the gate 21, the gate line and the common electrode line 22 formed thereon through a second patterning process; wherein, the etching stop layer 51 corresponds to the gap between a source 61 and a drain 62 which are to be formed, and a via hole 23 exposing the common electrode line 22 is formed above the common electrode line 22.

S03, at least an active layer 51, a pattern including a source 61, a drain 62 and a data line and a protection layer 71 are formed on the substrate with the gate insulation layer 30, the active layer film 40 and the etching stop layer 51 formed thereon through a third patterning process; wherein, the protection layer 71 exposes a part of the drain 62.

S04, at least a pixel electrode 81 is formed on the substrate with at least the active layer 41, the pattern including the source 61, the drain 62 and the data line and the protection layer 71 formed thereon through a fourth patterning process; wherein, the pixel electrode 81 is electrically connected with the drain 62.

It should be noted that, first, in all of the embodiments of the present invention, the patterning process may be any process in which a film layer (composed of one or more layer of films) is processed so as to form a certain pattern, one typical patterning process is a process in which one mask is applied and exposing photoresist, developing, etching and removing photoresist are included.

Here, the mask may be a general mask, or a halftone mask, or a gray-tone mask, and should be selected depending on the specific patterning process.

Second, although a gate line lead wire and a data line lead wire are not shown or mentioned in the embodiments of the present invention, the person skilled in the art should understand that the gate line lead wire connected with the gate line is formed while the gate line is formed through the first patterning process; similarly, the data line lead wire connected with the data line is formed while the data line is formed through the third patterning process.

Third, the common electrode line is used to supply a common voltage to the common electrode arranged on the color filter substrate corresponding to the array substrate.

With the manufacturing method of the array substrate 01 according to the embodiments of the present invention, the array substrate 01 with the etching stop layer 51 can be produced through only four patterning processes, and compared with the prior art in which at least five patterning processes are required, the manufacturing method provided by the present invention can reduce the manufacturing processes of the substrate effectively, improve the production efficiency, and reduce the cost.

Preferably, the above-described step S01 may specifically include the sub-steps S11 to S14.

Figure 2:
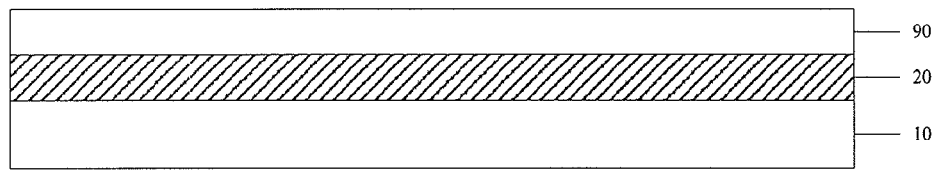
FIGS. 2(a) to 2(d) are schematic diagrams illustrating a manufacturing process of forming a pattern including a gate, a gate line and a common electrode line through a first patterning process, according to an embodiment of the present invention.

S11, as shown in FIG. 2(a), a gate metal film 20 and a photoresist layer 90 are sequentially formed on the substrate 10.

Here, the gate metal film 20 may be formed by using a single metal material or a metal alloy material selected from aluminum (Al), copper (Cu), molybdenum (Mo), chromium (Cr), and the like through a sputtering method or a thermal evaporation method, and may have a thickness in the range of, for example, 3000 Å to 5500 Å.

The photoresist layer 90 used in the embodiments of the present invention utilizes a positive photoresist material, that is, the photoresist layer 90 is not dissolved in the developing liquid before being exposed, and the photoresist layer 90 is changed into a material that can be dissolved in the developing liquid after being exposed to ultraviolet rays.

Figure 2B:
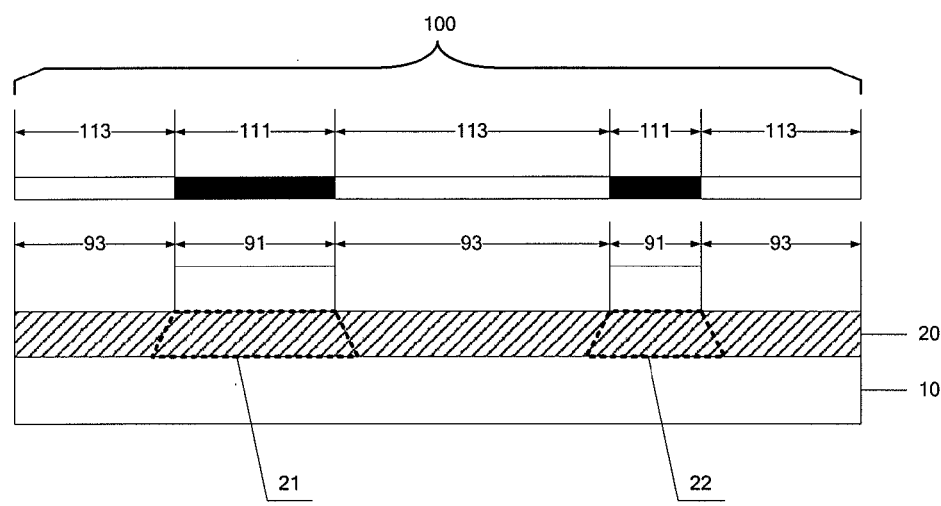

S12, on the substrate subjected to the step S11, as shown in FIG. 2(b), a photoresist completely remaining portion 91 and a photoresist completely removed portion 93 are formed after exposing and developing the substrate 10 with the photoresist 90 formed thereon by using a general mask 100; wherein, the photoresist completely remaining portion 91 corresponds to an area where the pattern including the gate 21, the gate line and the common electrode line 22 is to be formed, and the photoresist completely removed portion 93 corresponds to the other areas.

Here, the general mask 100 refers to a device in which a light blocking metal layer with a certain pattern is formed on a transparent substrate material to selectively expose the photoresist 90.

Here, an area that is covered by the light blocking metal layer is completely non-transparent, and an area that is not covered by the light blocking metal layer is completely transparent. When the general mask is utilized to expose the photoresist 90, since the ultraviolet rays cannot irradiate on the photoresist 90 corresponding to the completely non-transparent portion 111 of the general mask, the photoresist 90 corresponding to the completely non-transparent portion 111 forms the photoresist completely remaining portion 91 after being developed, whereas the photoresist 90 corresponding to the completely transparent portion 113 of the general mask forms the photoresist completely removed portion after being developed.

Accordingly, when etching a film layer covered by the photoresist 90, a part of the film layer covered by the photoresist completely remaining portion 91 will remain, and a part of the film layers covered by the photoresist completed removed portion 93 will be removed, so as to form a corresponding pattern.

Figure 2C:
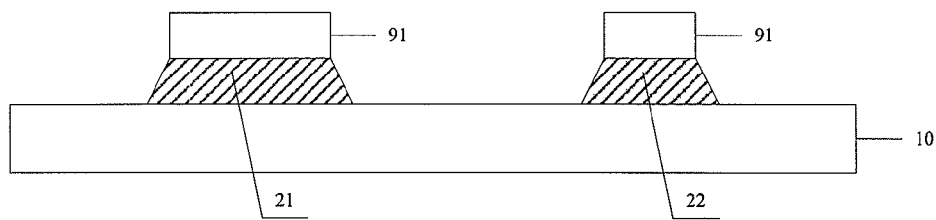

S13, as shown in FIG. 2(c), on the substrate subjected to the step S12, a part of the gate metal film 20 corresponding to the photoresist completely removed portion 93 (not shown) is removed by using a wet etching process, thus forming the pattern including the gate 21, the gate line and the common electrode line 22.

Here, an etching liquid utilized in the wet etching process may be, for example, an acid etching liquid such as nitric acid ($HNO_3$), phosphoric acid ($H_3PO_4$), or acetic acid ($CH_3COOH$).

Figure 2D:
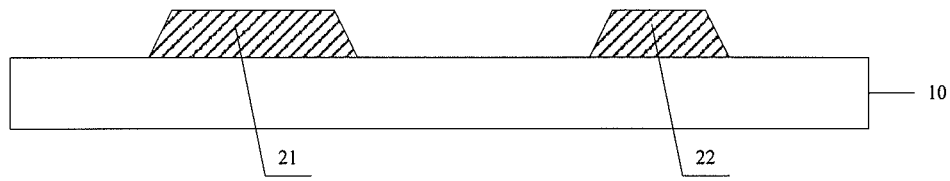

S14, as shown in FIG. 2(d), on the substrate subjected to the step S13, the photoresist of the photoresist completely remained portion 91 (not shown) is removed by using an ashing process, thus exposing the pattern including the gate 21, the gate line and the common electrode line 22.

Preferably, the above-described step S02 may specifically include six sub-steps S21-S26.

Figure 3A:
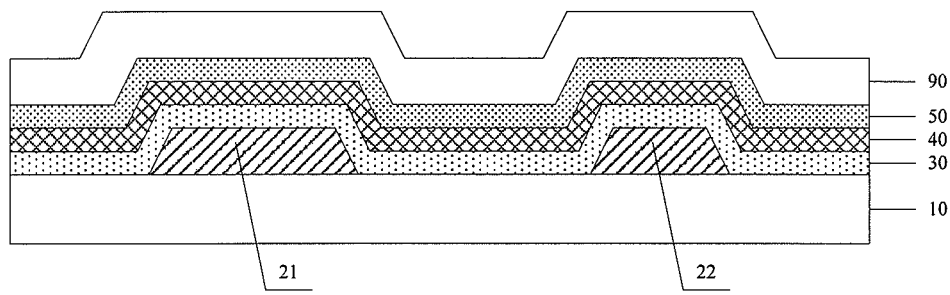
FIGS. 3(a) to 3(f) are schematic diagrams illustrating a manufacturing process of forming a gate insulation layer, an active layer film and an etching stop layer through a second patterning process, according to an embodiment of the present invention.

S21, as shown in FIG. 3(a), on the substrate subjected to the steps from S11 to S14, a gate insulation layer film 30, an active layer film 40 and an etching stop layer film 50 is formed, and a photoresist layer 90 is formed on the etching stop layer 50.

Here, the gate insulation layer film 30 and the etching stop layer film 50 may be formed by using a material with dense structure and good insulation performance (such as silicon nitride ($SiN_x$) or silicon dioxide ($SiO_2$)) through the Plasma Enhanced Chemical Vapor Deposition (PECVD), the thickness of the gate insulation layer film 30 may be, for example, from 3000 Å to 5000 Å, and the thickness of the etching stop layer film 50 may be, for example, from 300 Å to 2000 Å.

For the active layer film 40, manufacturing method and thickness thereof may be adjusted freely, depending on the various materials used for the active layer film 40.

For example, when the active layer film 40 is an amorphous silicon (a-Si) active layer film, it may be formed through PECVD method, and its thickness may be, for example, from 300 Å to 1000 Å. When the active layer film 40 is a metal-oxide semiconductor (for example, Indium Gallium Zinc Oxide, IGZO), it may be formed through magnetic controlled sputtering method or thermal evaporation method, and its thickness may be, for example, from 300 Å to 1000 Å.

Figure 3B:
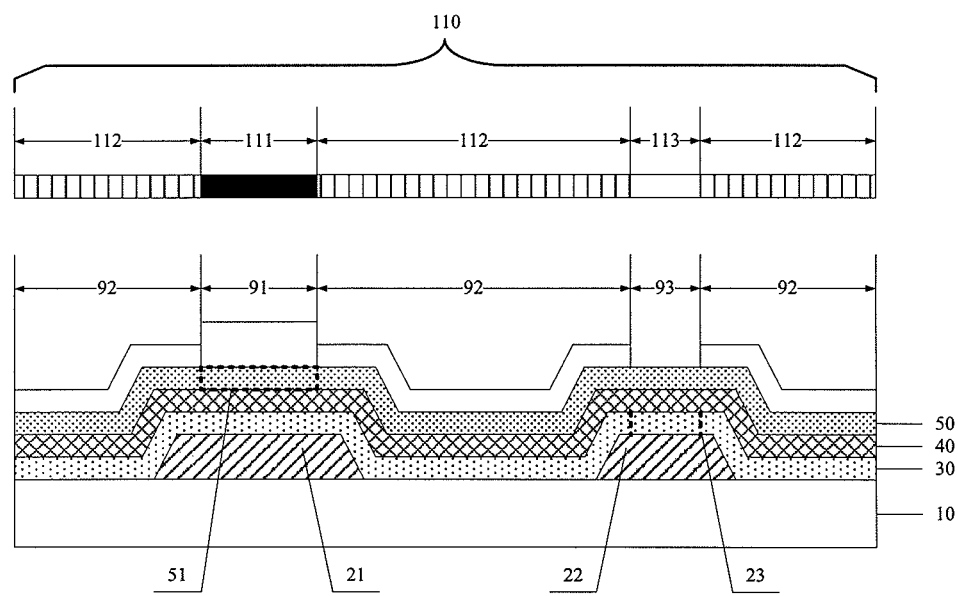

S22, as shown in FIG. 3(b), on the substrate subjected to the step S21, a photoresist completely remaining portion 91, a photoresist half-remaining portion 92 and a photoresist completely removed portion 93 are formed after exposing and developing the substrate with the photoresist layer 90 formed thereon by using a first halftone mask 110 or a first gray-tone mask; wherein, the photoresist completely remaining portion 91 corresponds to an area where the etching stop layer 51 is to be formed, the photoresist completely removed portion 93 corresponds to an area where the via hole 23 is to be formed, and the photoresist half-remaining portion 92 corresponds to the other areas.

Here, compared with the general mask used in the above step S12, the halftone mask 110 further include a semi-transparent portion 112; that is, the halftone mask 110 refers to a mask in which a non-transparent light blocking metal layer is formed on some areas of a transparent substrate material, a semi-transparent light blocking metal layer is formed on some other areas of the transparent substrate material and no light blocking metal layer is formed on the remaining areas of the transparent substrate material; wherein, the thickness of the semi-transparent light blocking metal layer is smaller than that of the non-transparent light blocking metal layer; in addition, the transmittance of the semi-transparent light blocking metal layer to the ultraviolet rays may be changed by adjusting the thickness of the semi-transparent light blocking metal layer.

Based on the above descriptions, the working principle of the half tone mask 110 is explained as following: by controlling the thickness of the light blocking metal layer in different areas of the half tone mask 110, the intensity of the transmitted light of the exposing light will be different in different areas, thereby forming a photoresist completely remaining portion 91, a photoresist half-remaining portion 92 and a photoresist completely removed portion 93 corresponding to the non-transparent portion 111, the semi-transparent portion 112 and the completely transparent portion 113 of the half tone mask 110, respectively, after selectively exposing and developing the photoresist 90. As such, during the first etching process, a part of a film layer covered by the photoresist completely remaining portion 91 and the photoresist half-remaining portion 92 will not be removed by etching; then, since the thickness of the photoresist completely remaining portion 91 is larger than that of the photoresist half-remaining portion 92, the photoresist corresponding to the photoresist completely remaining portion 91 will partially remain after removing the photoresist corresponding to the photoresist half-remaining portion 92 through an ashing process, so that the exposed part of the film layer may be selectively etched, thereby at least two layers of patterns with different patterns can be obtained.

The working principle of the gray-tone mask is similar with that of the halftone mask 110, therefore the description thereof is omitted, and only the difference between the gray-tone mask and the halftone mask will be described as following: the semi-transparent portion 112 of the half tone mask 110 is realized by forming a semi-transparent light blocking metal layer with a relatively thinner thickness on the transparent substrate material, that is, the transmittance of the ultraviolet rays is adjusted by controlling the thickness of the metal layer, thereby the exposure of the photoresist corresponding to the semi-transparent portion 112 is different from that of the other areas; the semi-transparent portion of the gray-tone mask is realized by forming a plurality of slit structures having a narrow-strip shape, when the ultraviolet rays pass through the slit structures, optical phenomenons such as scattering and diffraction occur, thereby the exposure of the photoresist corresponding to the semi-transparent portion is different from that of the other areas.

Figure 3C:
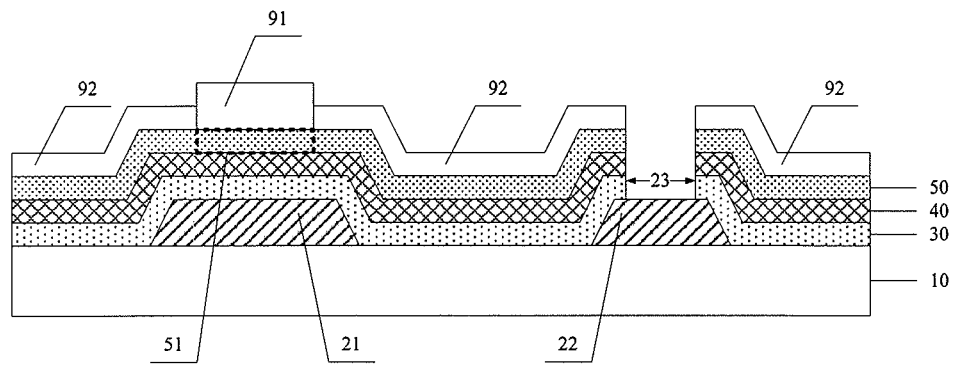

S23, as shown in FIG. 3(c), on the substrate subjected to the above step S22, parts of the etching stop layer film 50, the active layer film 40 and the gate insulation layer film 30 which are exposed in the photoresist completely removing portion 93 (not shown) are removed by using an etching process, thus forming the via hole 23.

Here, in consideration of that a wet etching process has poor controlling performance on forming a pattern having a relatively small critical dimension, the etching process preferably adopts a dry etching process using a plasma gas, so that the rate of the etching and the etching profile are controlled more accurately, thereby enabling the hole dimension parameter of the formed via hole 23 to be more accurate.

Figure 3D:
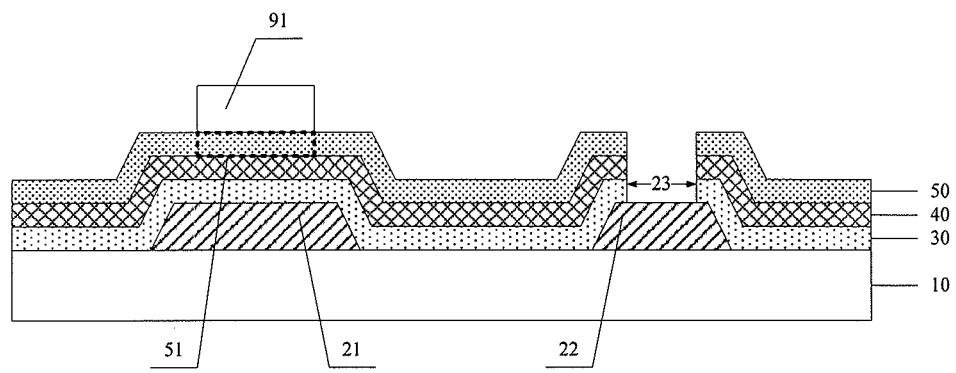

S24, as shown in FIG. 3(d), on the substrate subjected to the above step S23, the photoresist corresponding to the photoresist half-remaining portion 92 (not shown) is removed through an ashing process, thus exposing a part of the etching stop layer film 50.

Figure 3E:
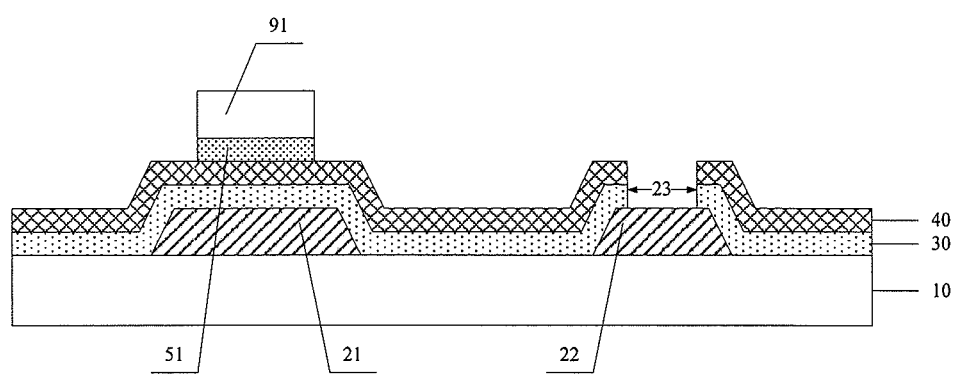

S25, as shown in FIG. 3(e), on the substrate subjected to the above step S24, the exposed part of the etching stop layer film 50 is removed by using an etching process, thus forming the etching stop layer 51.

Similarly, the etching process preferably adopts a dry etching process using a plasma gas, so that the rate of the etching and the etching profile are controlled more accurately, thereby enabling the related dimension parameters of the formed etching stop layer 51 to be more accurate.

Here, the etching stop layer 51 corresponds to the gap between a source 61 and a drain 62 which are to be formed; in consideration of that the width of the gap between the source 61 and the drain 62 is small, if the width of the etching stop layer 51 is set to be equal to that of the gap between the source 61 and the drain 62, an uneven etching or an over-etching easily occurs during forming the etching stop layer 51 by etching, therefore, preferably, in the embodiment of the present invention, the width of the etching stop layer is slightly wider than that of the gap between the source 61 and the drain 62 which are to be formed.

Figure 3F:
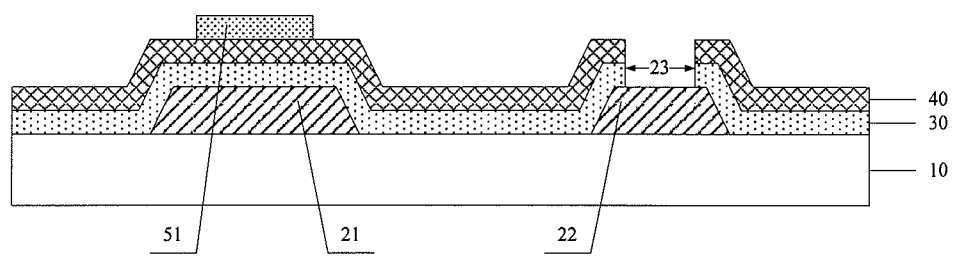

S26, as shown in FIG. 3(f), on the substrate subjected to the above step S25, the photoresist of the photoresist completely remained portion 91 (not shown) is removed by using a stripping process.

In a case where the amorphous silicon (a-Si) material is used for the active layer film 40 formed in the above step S02, the above step S03 preferably is:

forming an amorphous silicon active layer 41, an ohmic contact layer 121, a pattern including a source 61, a drain 62 and a data line and a protection layer 71 on the substrate with the gate insulation layer 30, the amorphous silicon layer film 40 and the etching stop layer 51 through a third patterning process; wherein, the protection layer 71 exposes a part of the drain 62; the ohmic contact layer 121 is at least contacted with the source 61, the drain 62 and the amorphous silicon active layer 41.

Here, the ohmic contact layer 121 is used to reduce the resistance between the amorphous silicon active layer 41 and the source 61 and the drain 62, thereby reducing the signal delay.

It can be known from the above description that, when the width of the etching stop layer 51 is slightly wider than that of the gap between the source 61 and the drain 62 which are to be formed, further preferably, in addition to the source 61, the drain 62 and the amorphous silicon active layer 41, the ohmic contact layer 121 is also contacted with the etching stop layer 51.

Preferably, the above step S03 may specifically include six sub-steps S31 to S36.

Figure 4A:
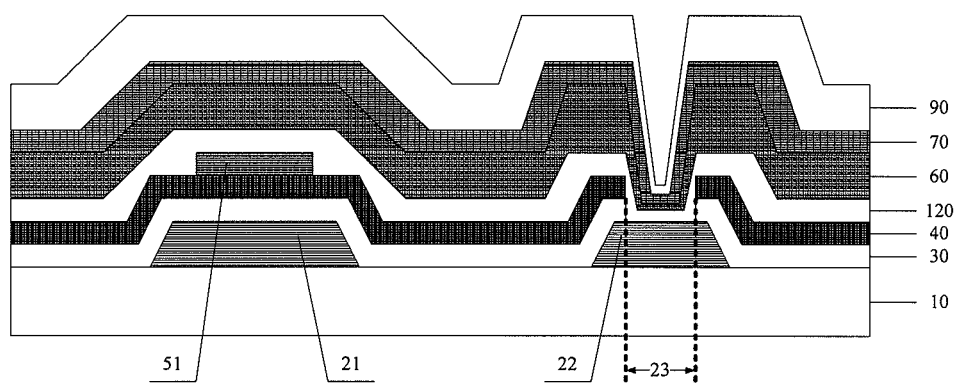
FIGS. 4(a) to 4(f) are schematic diagrams illustrating a manufacturing process of forming an amorphous silicon active layer, an ohmic contact layer, a pattern including a source, a drain and a data line and a protection layer through a third patterning process, according to an embodiment of the present invention.

S31, as shown in FIG. 4(a), on the substrate subjected to the above steps from S21 to S26, an ohmic contact layer film 120, a source-drain metal layer film 60 and a protection layer film 70 are sequentially formed, and a photoresist layer 90 is formed on the protection layer film 70.

Here, the ohmic contact layer film 120 may be formed by using a material such as N-doped amorphous silicon (n+a-Si) or the like through the PECVD method, and its thickness may be, for example, from 200 Å to 500 Å.

The source-drain metal layer film 60 may be formed by using a single metal material or a metal alloy material selected from aluminum (Al), copper (Cu), molybdenum (Mo), chromium (Cr), and the like through a sputtering method or a thermal evaporation method, and may have a thickness in the range of, for example, from 2500 Å to 5500 Å.

The protection layer film 70 may be formed by using a material with dense structure and good insulation performance (such as silicon nitride ($SiN_x$) or silicon dioxide ($SiO_2$)) through the PECVD method, and may have a thickness in the range of, for example, from 2000 Å to 7000 Å.

Figure 4B:
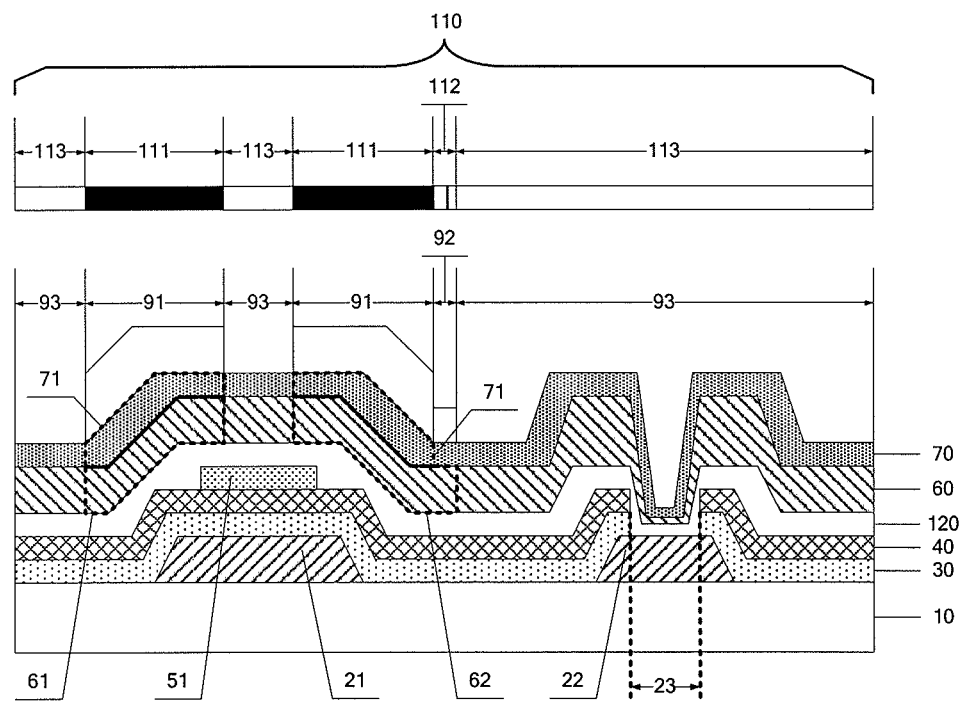

S32, as shown in FIG. 4(b), on the substrate subjected to the above step S31, a photoresist completely remaining portion 91, a photoresist half-remaining portion 92 and a photoresist completely removed portion 93 are formed after exposing and developing the substrate with the photoresist layer formed thereon by using a second halftone mask 110 or a second gray-tone mask; wherein, the photoresist completely remaining portion 91 corresponds to an area where the source 61, the drain 62 and the data line are to be formed, the photoresist half-remaining portion corresponds to an area in which the drain 62 is exposed by the protection layer 71 to be formed, and the photoresist completely removed portion 93 corresponds to the other areas.

Figure 4C:
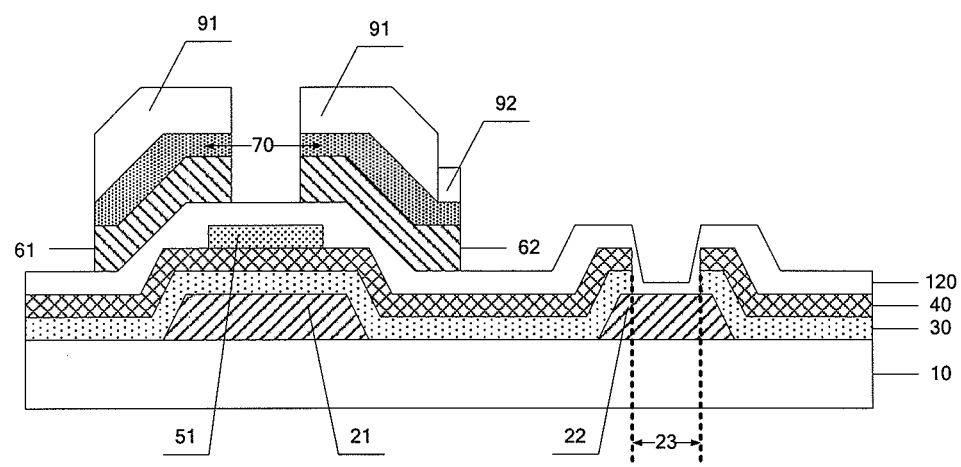

S33, as shown in FIG. 4(c), on the substrate subjected to the above step S32, parts of the protection layer film 70 and the source-drain metal layer film 60 which are exposed in the photoresist completely removed portion 93 (not shown) are removed by using an etching process, thus forming the pattern including the source 61, the drain 62 and the data line, and exposing a part of the ohmic contact layer film 120.

Here, since the rate of the etching and the formed etching profile can be controlled more accurately by using a dry etching process, the exposed portion of protection layer film 70 is firstly etched through a dry etching process utilizing a plasma gas; after that, since a wet etching process can offer a relatively large etch selectivity ratio, and can avoid over-etching, the source-drain metal layer film 60 is etched by using a wet etching process so as to form the pattern including the source 61, the drain 62 and the data line.

Figure 4D:
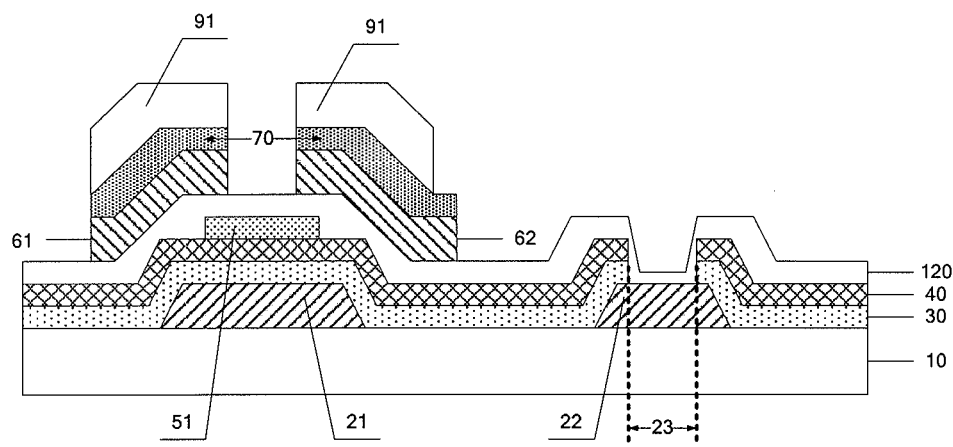

S34, as shown in FIG. 4(d), on the substrate subjected to the above step S33, the photoresist corresponding to the photoresist half-remaining portion 92 (not shown) is removed by using an ashing process, thus exposing a part of the protection layer film 70.

Figure 4E:
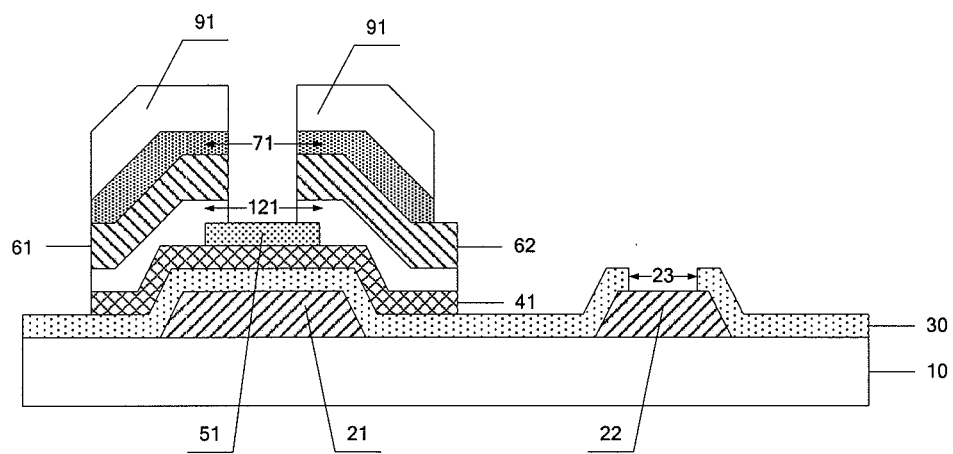

S35, as shown in FIG. 4(e), on the substrate subjected to the above step S34, the exposed parts of the ohmic contact layer film 120 and active layer film 40 are removed by using an etching process, thus forming the ohmic contact layer 121, the active layer 41 and the protection layer 71; wherein, the protection layer 71 exposes a part of the drain 62.

Also, the etching process is preferably adopts a dry etching process using a plasma gas, so that the rate of the etching and the etching profile can be controlled more accurately, thereby enabling the related dimension parameters of the formed ohmic contact layer 121, active layer 51 and protection layer 71 to be more accurate.

Figure 4F:
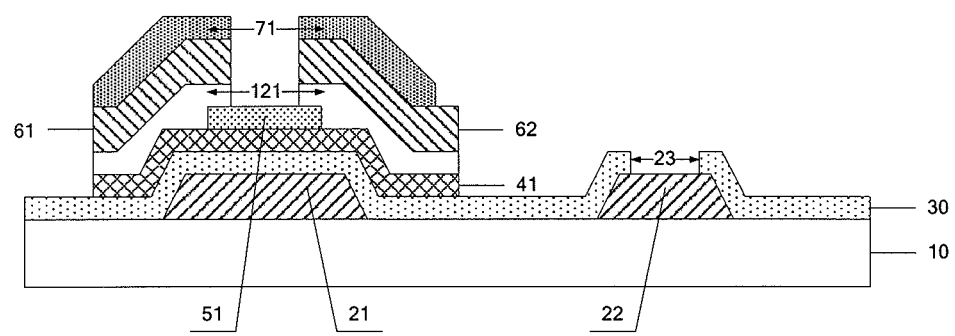

S36, as shown in FIG. 4(f), on the substrate subjected to the above step S35, the photoresist corresponding to the photoresist completely remaining portion 91 is removed by using a stripping process.

Based on the above, when the common electrode is supplied with a common voltage through the common electrode line 22, in order to make the common electrode signal more uniform, the above step S04 further preferably is: also forming a common electrode via hole connecting line 82 through the fourth patterning process, and the common electrode via hole connecting line 82 is electrically connected with the common electrode line 22, in this case, the common electrode via hole connecting line 82 and the common electrode line constitutes a grid-like connecting lines, thereby enabling the common electrode signal to be more uniform.

Preferably, the above step S04 may specifically include four sub-steps S41 to S44.

Figure 5A:
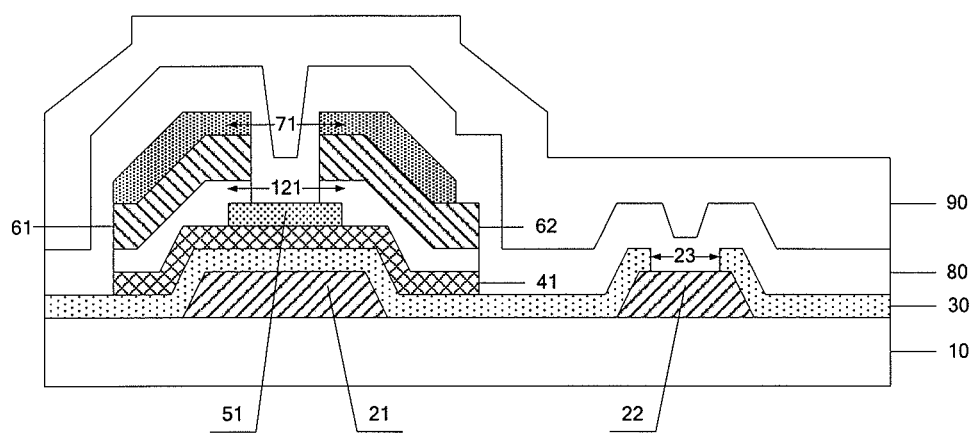
FIGS. 5(a) to 5(c) are schematic diagrams illustrating a manufacturing process of forming a pixel electrode and a common electrode via hole connecting line through a fourth patterning, according to an embodiment of the present invention.

S41, as shown in FIG. 5(a), a transparent electrode film 80 is formed on the substrate subjected to the above steps from S31 to S36, and a photoresist layer 90 is formed on the transparent electrode film 80.

Here, the transparent electrode film 80 may be formed by using a transparent electrode material such as Indium Tin Oxide (ITO) through the PECVD method, and may have a thickness in the range of, for example, from 200 Å to 1000 Å.

Figure 5B:
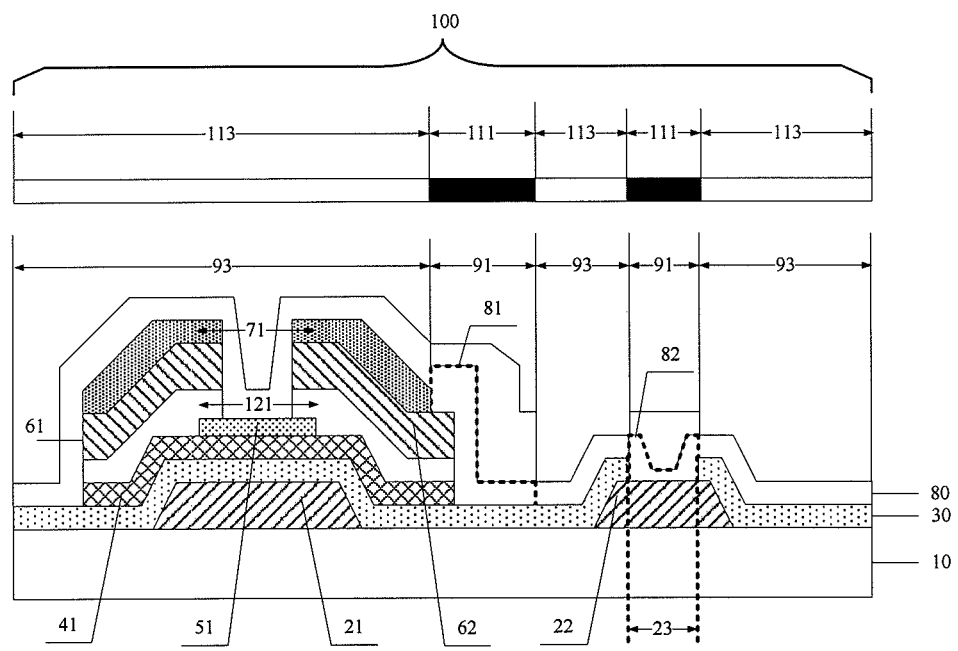

S42, as shown in FIG. 5(b), on the substrate subjected to the above step S41, a photoresist completely remaining portion 91 and a photoresist completely removed portion 93 are formed after exposing and developing the substrate with the photoresist layer 90 formed thereon by using a general mask 100; wherein, the photoresist completely remaining portion 91 corresponds to an area where the pixel electrode 81 and the common electrode via hole connecting line 82 are to be formed, and the photoresist completely removed portion corresponds to the other areas.

Figure 5C:
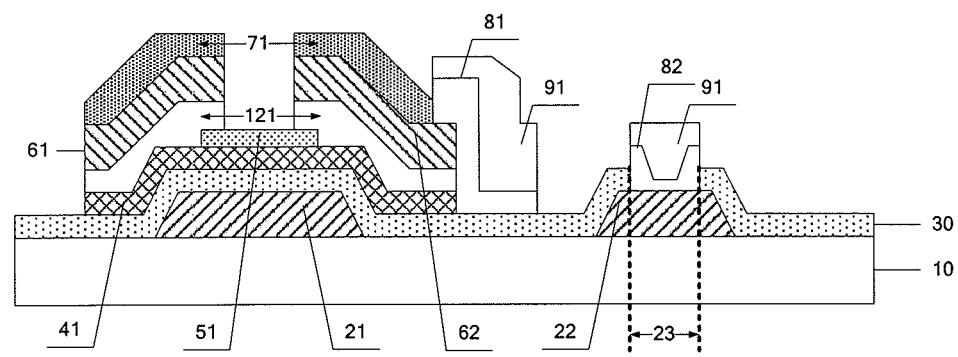

S43, as shown in FIG. 5(c), on the substrate subjected to the above step 42, a part of the transparent electrode film 80 which is exposed in the photoresist completely removed portion 93 (not shown) is removed by using an etching process, thus forming the pixel electrode 81 and the common electrode via hole connecting line.

Here, in consideration of that a wet etching process offers a relatively large etch selectivity ratio, and can avoid over-etching, the etching process uses a wet etching process.

Figure 5D:
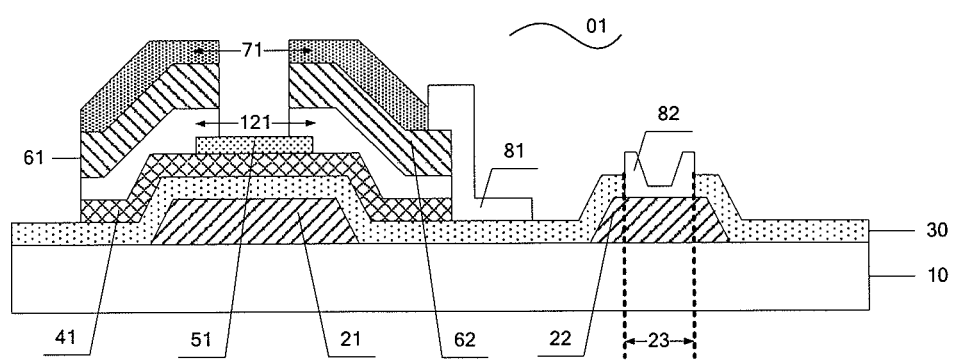
FIG. 5(d) is a schematic diagram illustrating a structure of an array substrate formed by using the manufacturing method of an array substrate according to an embodiment of the present invention.

S44, on the substrate subjected to the above step S43, the photoresist corresponding to the photoresist completely remaining portion 91 (not shown) is removed by using a stripping process, thus forming the array substrate 01 as shown in FIG. 5(d).

With the manufacturing method of the array substrate 01 provided by the embodiments of the present invention, the array substrate 01 with the etching stop layer 51 can be produced by using only four patterning processes, and compared with the prior art in which at least five patterning processes are required, the manufacturing method of the array substrate 01 provided by the present invention can reduce the manufacturing processes of the substrate effectively, improve the production efficiency and reduce the cost.

It should be noted that all the accompanying drawings of the present invention are only the schematic views of the above-described array substrate in brief, and are only used to clearly illustrate the structures relating to the inventive point of the present invention. For other structures which are irrelevant to the inventive point of the present invention or known in the prior art are only partly shown or not shown.

In addition, although the embodiments of the present invention are described by only taking that the source is connected with the data line and the drain is electrically connected with the anode as an example, the person skilled in the art should understand that, since the source and the drain are exchangeable in structure and composition, the drain can be connected with the data line and the source can be electrically connected with the anode, which is an equivalent of the embodiments of the present invention.

The embodiments described above are only the specific implementations of the present invention, but the protection scope of the present invention is not limited thereto. Any variation or alternative that can be easily conceived by the person skilled in the art within the technical specification disclosed in the present invention should fall within the protection scope of the present invention, which is defined by the appended claims.

What is claimed is:

1. A manufacturing method of an array substrate, the method including steps of:
   forming a pattern including a gate, a gate line and a common electrode line on a substrate through a first patterning process;
   forming a gate insulation layer, an active layer film and an etching stop layer on the substrate with the pattern including the gate, the gate line and the common electrode line formed thereon through a second patterning process; wherein, the etching stop layer corresponds to a gap between a source and a drain which are to be formed, and a via hole exposing the common electrode line is formed above the common electrode line;
   forming at least an active layer, a pattern including the source, the drain and a data line and a protection layer on the substrate with the gate insulation layer, the active layer film and the etching stop layer formed thereon through a third patterning process; wherein, the protection layer exposes a part of the drain; and
   forming at least a pixel electrode on the substrate with at least the active layer, the pattern including the source, the drain and the data line and the protection layer formed thereon through a fourth patterning process; wherein, the pixel electrode is electrically connected with the drain at least through the exposed part of the drain.

2. The manufacturing method according to claim 1, wherein, the step of forming a gate insulation layer, an active layer film and an etching stop layer on the substrate with the pattern including the gate, the gate line and the common electrode line formed thereon through a second patterning process; wherein, the etching stop layer corresponds to a gap between a source and a drain which are to be formed, and a via hole exposing the common electrode line is formed above the common electrode line, includes sub-steps of:
   sequentially forming a gate insulation layer film, an active layer film and an etching stop layer film on the substrate with the pattern including the gate, the gate line and the common electrode line formed thereon, and forming a photoresist layer on the etching stop layer film;
   forming a photoresist completely remaining portion, a photoresist half-remaining portion and a photoresist completely removed portion after exposing and developing the substrate with the photoresist layer formed thereon by using a first halftone mask or a first graytone mask; wherein, the photoresist completely remaining portion corresponds to an area where the etching stop layer is to be formed, the photoresist completely removed portion corresponds to an area where the via hole is to be formed, and the photoresist half-remaining portion corresponds to the other areas; removing parts of the etching stop layer film, the active layer film and the gate insulation layer film which are exposed in the photoresist completely removed portion by using an etching process, thus forming the via hole;

removing the photoresist corresponding to the photoresist half-remaining portion by using an ashing process, thus exposing a part of the etching stop layer film;

removing the exposed part of the etching stop layer film by using an etching process, thus forming the etching stop layer; and removing the photoresist corresponding to the photoresist completely remaining portion by using a stripping process.

3. The manufacturing method according to claim 1, wherein, the active layer film includes an amorphous silicon active layer film; and the step of forming at least an active layer, a pattern including the source, the drain and a data line and a protection layer on the substrate with the gate insulation layer, the active layer film and the etching stop layer formed thereon through a third patterning process; wherein, the protection layer exposes a part of the drain, includes a step of:

forming an amorphous silicon active layer, an ohmic contact layer, a pattern including the source, the drain and the data line and the protection layer on the substrate with the gate insulation layer, the amorphous silicon active layer film and the etching stop layer formed thereon through the third patterning process; wherein, the protection layer exposes a part of the drain; the ohmic contact layer is at least contacted with the source, the drain and the amorphous silicon active layer.

4. The manufacturing method according to claim 3, wherein, the formed ohmic contact layer is also contact with the etching stop layer.

5. The manufacturing method according to claim 3, wherein, the step of forming an amorphous silicon active layer, an ohmic contact layer, the pattern including the source, the drain and the data line and the protection layer on the substrate with the gate insulation layer, the amorphous silicon active layer film and the etching stop layer formed thereon through the third patterning process; wherein, the protection layer exposes a part of the drain; the ohmic contact layer is at least contacted with the source, the drain and the amorphous silicon active layer, includes sub-steps of:

forming an ohmic contact layer film, an source-drain metal layer film and a protection layer film on the substrate with the gate insulation layer, the amorphous silicon layer film and the etching stop layer formed thereon, and forming a photoresist layer on the protection layer film;

forming a photoresist completely remaining portion, a photoresist half-remaining portion and a photoresist completely removed portion after exposing and developing the substrate with the photoresist layer formed thereon by using a second halftone mask or a second gray-tone mask; wherein, the photoresist completely remaining portion corresponds to an area where the source, the drain and the data line are to be formed, the photoresist half-remaining portion corresponds to an area where the protection layer to be formed exposes the drain, and the photoresist completely removed portion corresponds to the other areas;

removing parts of the protection layer film and the source-drain metal layer film which are exposed in the photoresist completely removed portion by using an etching process, thus forming the pattern including the source, the drain and the data line, and exposing a part of the ohmic contact layer film;

removing the photoresist corresponding to the photoresist half-remaining portion by using an ashing process, thus exposing a part of the protection layer film;

removing the exposed parts of the ohmic contact layer film and amorphous silicon layer film by using an etching process, thus forming the ohmic contact layer, the active layer and the protection layer; wherein, the protection layer exposes a part of the drain; and removing the photoresist corresponding to the photoresist completely remained portion by using a stripping process.

6. The manufacturing method according to claim 3, wherein, the ohmic contact layer includes a N-doped amorphous silicon layer.

7. The manufacturing method according to claim 4, wherein, the ohmic contact layer includes a N-doped amorphous silicon layer.

8. The manufacturing method according to claim 5, wherein, the ohmic contact layer includes a N-doped amorphous silicon layer.

9. The manufacturing method according to claim 1, wherein, the step of forming at least a pixel electrode on the substrate with at least the active layer, the pattern including the source, the drain and the data line and the protection layer formed thereon through a fourth patterning process; wherein, the pixel electrode is electrically connected with the drain, includes a step of:

forming a pixel electrode and a common electrode via hole connecting line on the substrate with at least the active layer, the pattern including the source, the drain and the data line and the protection layer formed thereon through the fourth patterning process; wherein, the pixel electrode is electrically connected with the drain; and the common electrode via hole connecting line is electrically connected with the common electrode line.

10. The manufacturing method according to claim 9, wherein, the step of forming a pixel electrode and a common electrode via hole connecting line on the substrate with at least the active layer, the pattern including the source, the drain and the data line and the protection layer formed thereon through the fourth patterning process;

wherein, the pixel electrode is electrically connected with the drain; and the common electrode via hole connecting line is electrically connected with the common electrode line, includes sub-steps of:

forming a transparent electrode film on the substrate with at least the active layer, the pattern including the source, the drain and the data line and the protection layer formed thereon, and forming a photoresist layer on the transparent electrode film;

forming a photoresist completely remaining portion and a photoresist completely removed portion after exposing and developing the substrate with the photoresist layer formed thereon by using a mask; wherein, the photoresist completely remaining portion corresponds to areas where the pixel electrode and the common electrode wire via hole connecting line are to be formed, the photoresist completely removed portion corresponds to the other areas;

removing a part of the transparent electrode film exposed in the photoresist completely removed portion by using an etching process, thus forming the pixel electrode and the common electrode via hole connecting line; and removing the photoresist corresponding to the photoresist completely remaining portion by using a stripping process.

\* \* \* \* \*